(12) United States Patent
Park et al.

(10) Patent No.: US 7,906,398 B2
(45) Date of Patent: Mar. 15, 2011

(54) METHOD OF FABRICATING SEMICONDUCTOR DEVICE

(75) Inventors: Sang-Hoon Park, Icheon-si (KR); Yun-Seok Cho, Icheon-si (KR); Sang-Hoon Cho, Icheon-si (KR); Chun-Hee Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 36 days.

(21) Appl. No.: 12/336,487

(22) Filed: Dec. 16, 2008

(65) Prior Publication Data

US 2009/0253254 A1    Oct. 8, 2009

(30) Foreign Application Priority Data

Apr. 4, 2008    (KR) .................. 10-2008-0031477

(51) Int. Cl.
    *H01L 21/336* (2006.01)
(52) U.S. Cl. .. 438/268; 438/270; 438/585; 257/E21.645
(58) Field of Classification Search .................. 438/268, 438/270, 253, 585, 596; 257/E21.645
    See application file for complete search history.

(56) References Cited

U.S. PATENT DOCUMENTS

| | | | | |
|---|---|---|---|---|
| 5,072,269 A | * | 12/1991 | Hieda | 257/302 |
| 6,150,688 A | | 11/2000 | Maeda et al. | |
| 2004/0164338 A1 | * | 8/2004 | Koyama | 257/301 |
| 2009/0163006 A1 | * | 6/2009 | Lee | 438/585 |

FOREIGN PATENT DOCUMENTS

| | | | |
|---|---|---|---|
| CN | 101093855 | | 12/2007 |
| KR | 10-0660881 | | 12/2006 |
| KR | 10-2006-0071886 | * | 2/2008 |
| KR | 10-2008-0011491 | | 5/2008 |
| KR | 100905789 | | 6/2009 |
| KR | 1020090067532 | | 6/2009 |

OTHER PUBLICATIONS

Office Action dated Jan. 21, 2010, for Korean application No. 10-2008-0031477.
Korean Notice of Allowance for Korean application 10-2008-0031477.
Chinese Office Action for application No. 200910132611.0, dated Oct. 11, 2010.

* cited by examiner

*Primary Examiner* — Michael Trinh
(74) *Attorney, Agent, or Firm* — Lowe Hauptman Ham & Berner LLP (57) ABSTRACT

In a method of fabricating a semiconductor device having vertical channels and a method of patterning a gate electrode of such semiconductor device, an initial conductive layer is removed by multiple etching processes.

15 Claims, 7 Drawing Sheets

ISOTROPHIC ETCHING

ANISOTROPIC ETCHING

METHOD OF FABRICATING SEMICONDUCTOR DEVICE

CROSS-REFERENCE TO RELATED APPLICATIONS

The present invention claims priority of Korean patent application number 10-2008-0031477, filed on Apr. 4, 2008, which is incorporated herein by reference in its entirety.

BACKGROUND

The disclosure relates to a method of fabricating a semiconductor device, and more particularly, to a method of fabricating a semiconductor device having channels formed in a top-to-bottom direction (referred to herein as vertical channels).

To reduce size, semiconductor devices are designed to have vertical channels by disposing a source region and a drain region in the upper and lower parts of an active region.

Figure 1A:
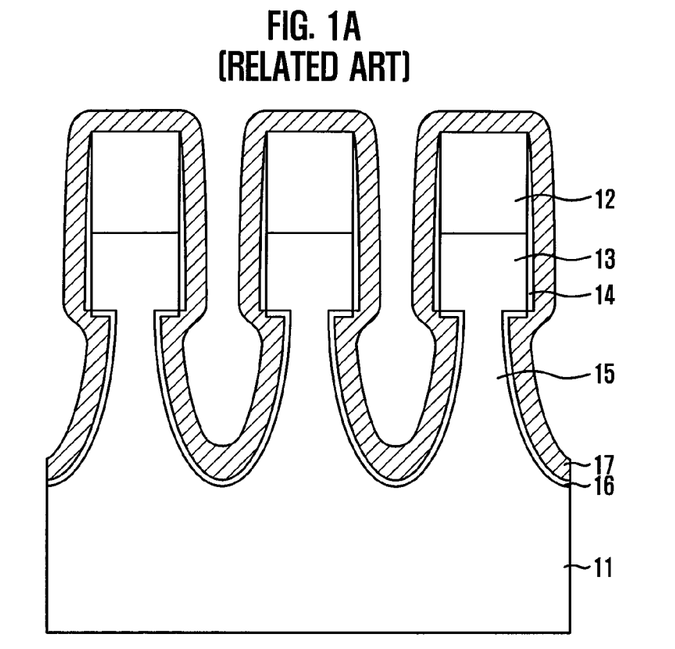
FIGS. 1A and 1B are schematic cross-sectional views describing a known method of fabricating a semiconductor device having vertical channels.
Figure 1B:
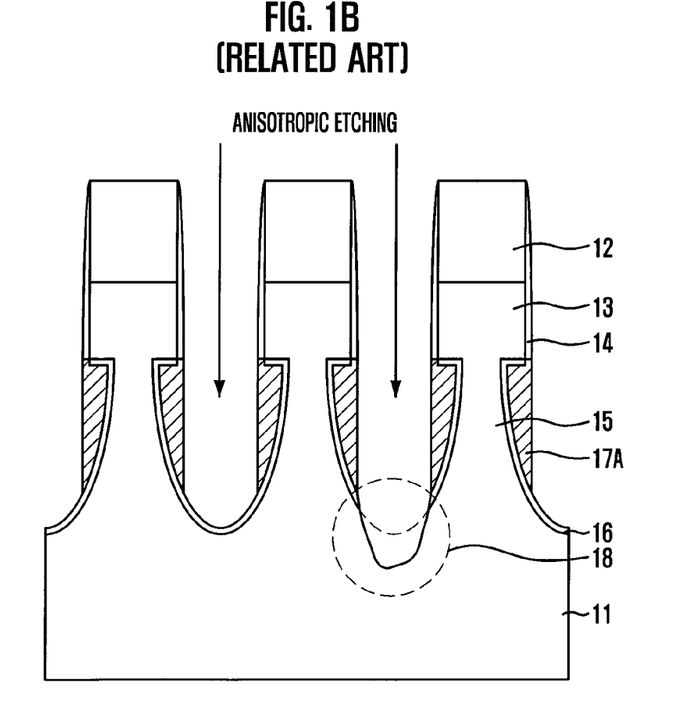

FIGS. 1A and 1B are schematic cross-sectional views describing a method known to the inventors as being capable of fabricating a semiconductor device having vertical channels.

As shown in FIG. 1A, a plurality of gate hard mask patterns 12 are formed on a substrate 11, and pillar heads 13 are formed using the plurality of gate hard mask patterns as etch barriers or masks. Then, a sidewall passivation layer 14 is formed on sidewalls of each pillar head 13 and the respective gate hard mask pattern 12, and a pillar neck 15 is formed by isotropically etching the substrate 11 using the sidewall passivation layer 14 as an etch barrier or mask. The pillar neck 15 together with the pillar head 13 defines a pillar pattern.

Then, a gate insulation layer 16 is formed on a part of the pillar head 13 and the pillar neck 15, and a conductive layer 17 is deposited along the profile of the substrate.

As shown in FIG. 1B, a gate electrode 17A is formed to surround the pillar neck 15 by anisotropically etching the conductive layer 17.

In the known fabricating method, it is potential that the substrate 11 is partially lost as shown in the circle 18 of FIG. 1B during the anisotropic etching of the conductive layer 17. The potential loss of the substrate 11 deteriorates operation characteristics of the manufactured semiconductor device.

In particular, the anisotropic etching of the conductive layer 17 is performed until the sidewall passivation layer 14 formed at the side walls of the pillar head 13 is exposed. Thus, it is potential that the conductive layer 17 deposited between adjacent pillar patterns may be over-etched. Accordingly, a portion of the substrate 11 is potentially unintentionally lost as shown in the circle 18 of FIG. 1B.

Although an etching recipe having excellent selectivity may be used for the anisotropic etching of the conductive layer 17, there is still a limitation because the selectivity is not limitless.

SUMMARY

In accordance with one or more embodiments, a method of fabricating a semiconductor device on a substrate comprises: forming at least one pillar pattern having a pillar head and a pillar neck on the substrate; forming a gate insulation layer that surrounds the pillar neck; forming a conductive layer over the substrate having the gate insulation layer on the pillar neck; and forming a gate electrode that surrounds the gate insulation layer on the pillar neck by performing multiple etching processes on the conductive layer.

In accordance with one or more embodiments, a method of forming a gate electrode from a conductive layer deposited over a substrate having thereon at least one pillar pattern, which comprises a pillar head, a pillar neck and a gate insulation layer that surrounds the pillar neck, comprises: performing sequentially multiple different etching processes on the conductive layer to form the gate electrode that surrounds the gate insulation layer on the pillar neck; wherein each of the multiple etching processes removes partially a thickness of the conductive layer to reduce the possibility of over-etching the substrate and/or the gate insulation layer.

BRIEF DESCRIPTION OF THE DRAWINGS

Various embodiments are illustrated by way of example, and not by limitation, in the figures of the accompanying drawings, wherein elements having the same reference numeral designations represent like elements throughout.

DESCRIPTION OF EMBODIMENTS

Figure 2A:
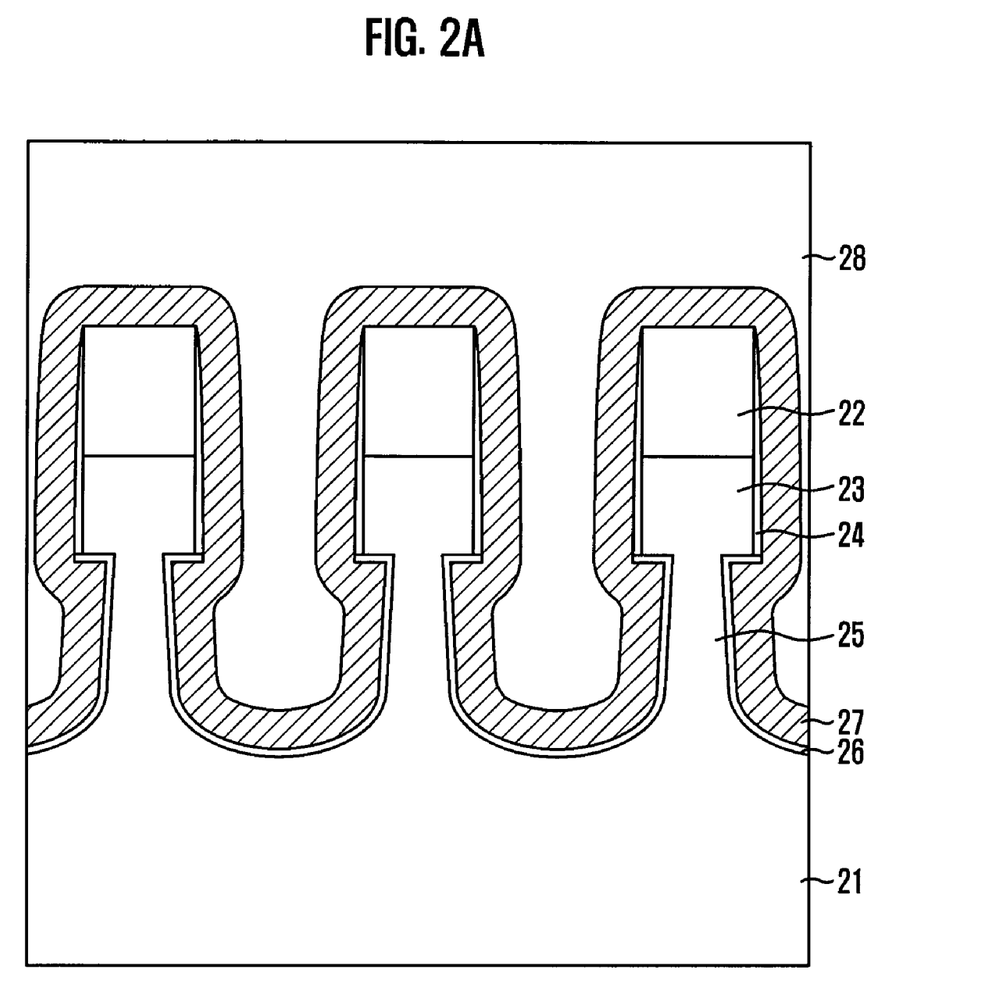
FIGS. 2A to 2F are schematic cross-sectional views illustrating a method of fabricating a semiconductor device having vertical channels in accordance with some embodiments.

As shown in FIG. 2A, a plurality of gate hard mask patterns 22 are formed on a substrate 21, and a pillar head 23 is formed by etching the substrate 21 using the plurality of gate hard mask patterns 22 as etch barriers or masks.

The gate hard mask patterns 22 are made, in some embodiments, of a nitride layer, particularly, a silicon nitride layer.

A sidewall passivation layer 24 is formed on side walls of the respective gate hard mask pattern 22 and pillar head 23, and a pillar neck 25 is formed by anisotropically etching the substrate 21 using the sidewall passivation layer 24 as an etch barrier or mask.

The sidewall passivation layer 24 is formed by performing an etch back process after depositing a nitride layer along the profile of the substrate having the pillar heads 23.

Hereinafter, the pillar head 23 with the respective pillar neck 25 is referred to as a pillar pattern. The pillar pattern is an active region.

Then, a gate insulation layer 26 is formed to surround at least the pillar neck 25.

A conductive layer 27 is formed over the substrate having the pillar patterns and the gate insulation layer 26 formed thereon.

The conductive layer 27 in some embodiments is formed of at least a polysilicon layer and/or at least a metal layer. The metal layer for the conductive layer 27 comprises at least one selected from the group consisting of tungsten (W), cobalt (Co), nickel (Ni), titanium nitride layer (TiN), and titanium (Ti). For example, the conductive layer 27 in an embodiment includes a stacked structure of titanium and titanium nitride layers.

Then, a sacrificial layer 28 is formed on the entire upper surface of the substrate having the conductive layer 27.

The sacrificial layer 28 protects the gate insulation layer 26 and the substrate 21 between the pillar patterns in the following process. As the sacrificial layer 28, an insulation layer that completely fills a gap between the adjacent pillar patterns can be used. For example, the sacrificial layer 28 in some embodiments may be a spin on dielectric layer that is deposited through spin coating.

Figure 2B:
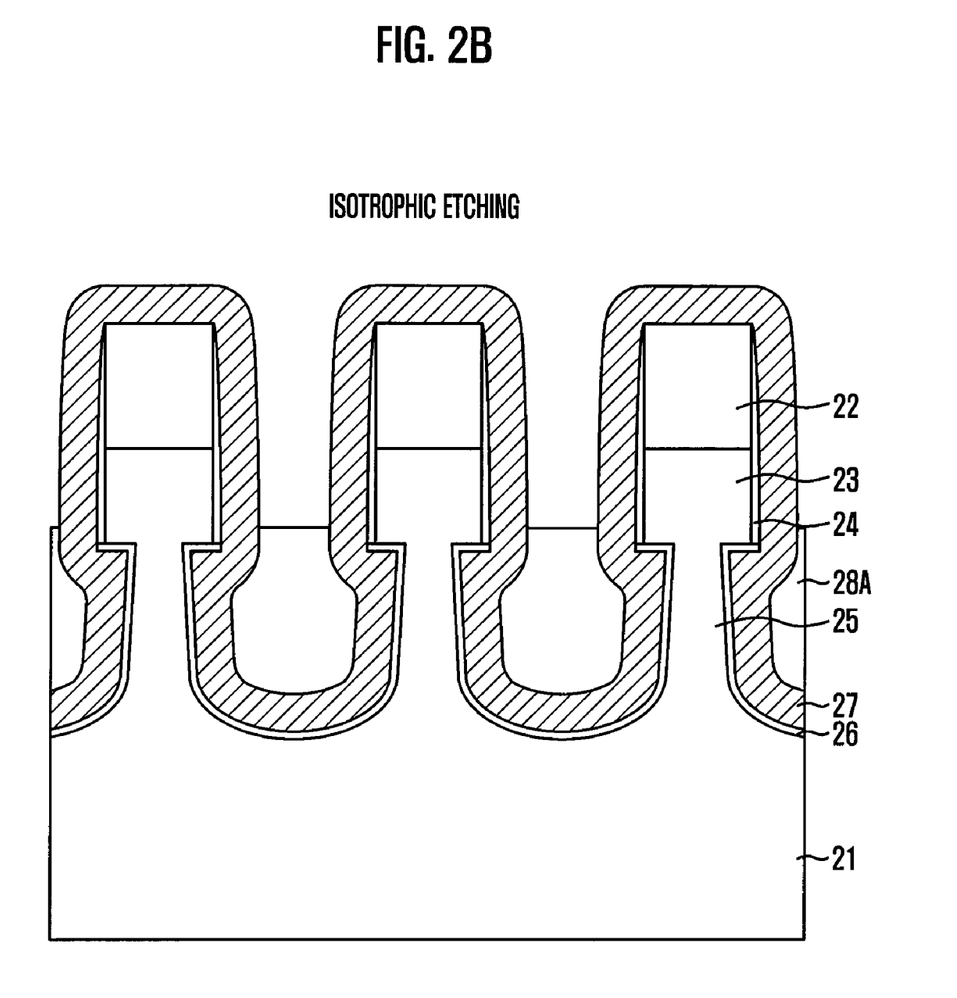

As shown in FIG. 2B, a sacrificial pattern 28A is formed by partially removing a portion of the sacrificial layer 28. Therefore, a portion of the conductive layer 27 formed on the top wall of the gate hard mask pattern 22 and sidewalls of the pillar head 23 and the gate hard mask pattern 22 is exposed.

An isotropic etching process is performed in some embodiments for partially removing the sacrificial layer 28. In some embodiments, the isotropic etching process is performed with an etching target set higher than a boundary between the pillar head 23 and the pillar neck 25. That is, a top surface of the sacrificial layer pattern 28A after the isotropic etching process remains higher than the boundary between the pillar head 23 and the pillar neck 25.

Figure 2C:
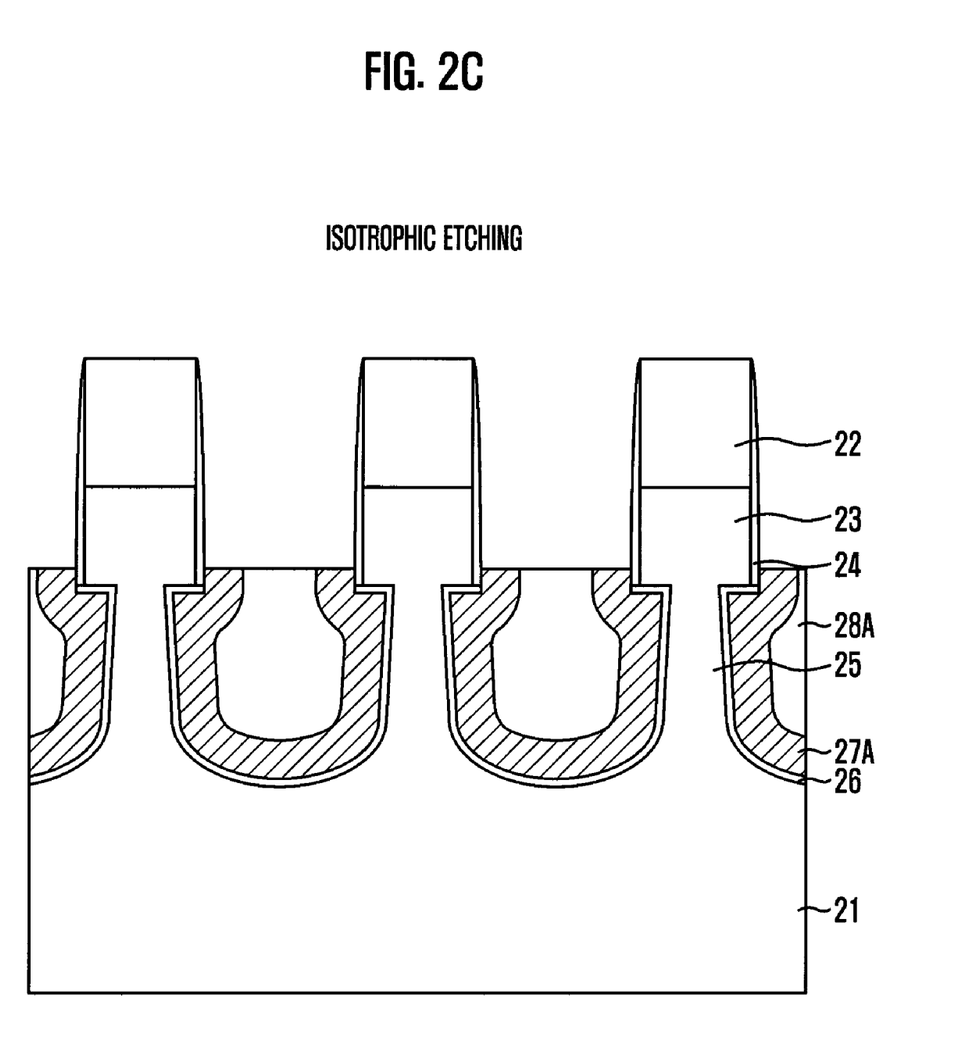

As shown in FIG. 2C, the exposed portion of the conductive layer 27 is removed, in some embodiments, by performing an isotropic etching process. During the isotropic etching process, the conductive layer 27 formed on the sidewalls of the pillar neck 25 is protected by the sacrificial layer 28, and only the exposed portion of the conductive layer 27 formed above the top surface of the sacrificial layer pattern 28A is etched. As a result, an once-etched conductive layer 27A is obtained.

Figure 2D:
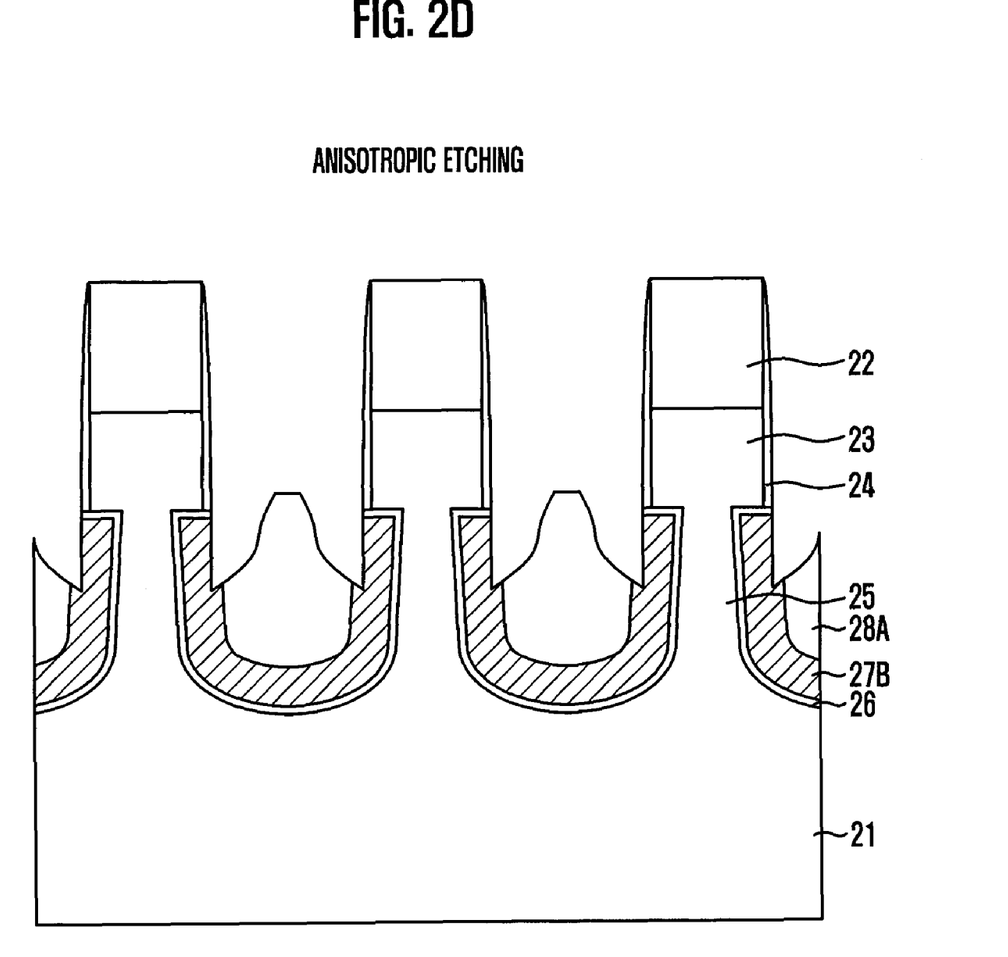

As shown in FIG. 2D, the once-etched conductive layer 27A at the boundary between the pillar head 23 and the pillar neck 25 is partially removed, in some embodiments, by performing an anisotropic etching process using the sidewall passivation layer 24 as an etch barrier or mask. The etching recipe in some embodiments is selected so that the conductive layer 27 and the adjacent portion of the sacrificial layer pattern 28A are etched faster than the central portion of the sacrificial layer pattern 28A between adjacent pillar patterns. Therefore, the once-etched conductive layer 27A becomes a twice-etched conductive layer 27B having a vertical profile at the boundary between the pillar head 23 and the pillar neck 25.

Figure 2E:
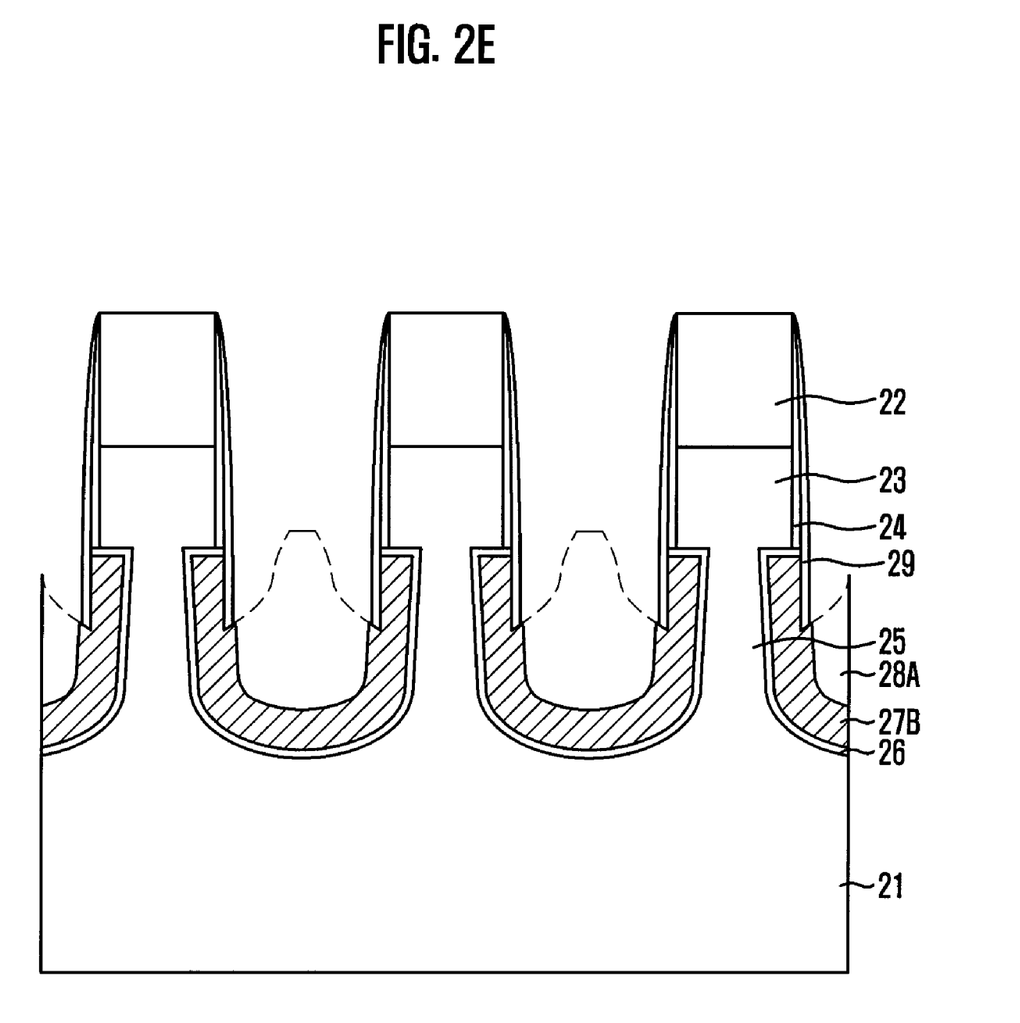

As shown in FIG. 2E, an insulation layer is first deposited over the substrate having the twice-etched conductive layer 27B, and then formed into a passivation layer 29 having a spacer shape by performing an anisotropic etching process.

The passivation layer 29 is a thin film made of a nitride layer that reinforces the sidewall passivation layer 24 for preventing the pillar pattern from being exposed in a following process.

Then, the sacrificial layer 28A is removed, in some embodiments, by wet-etching.

Figure 2F:
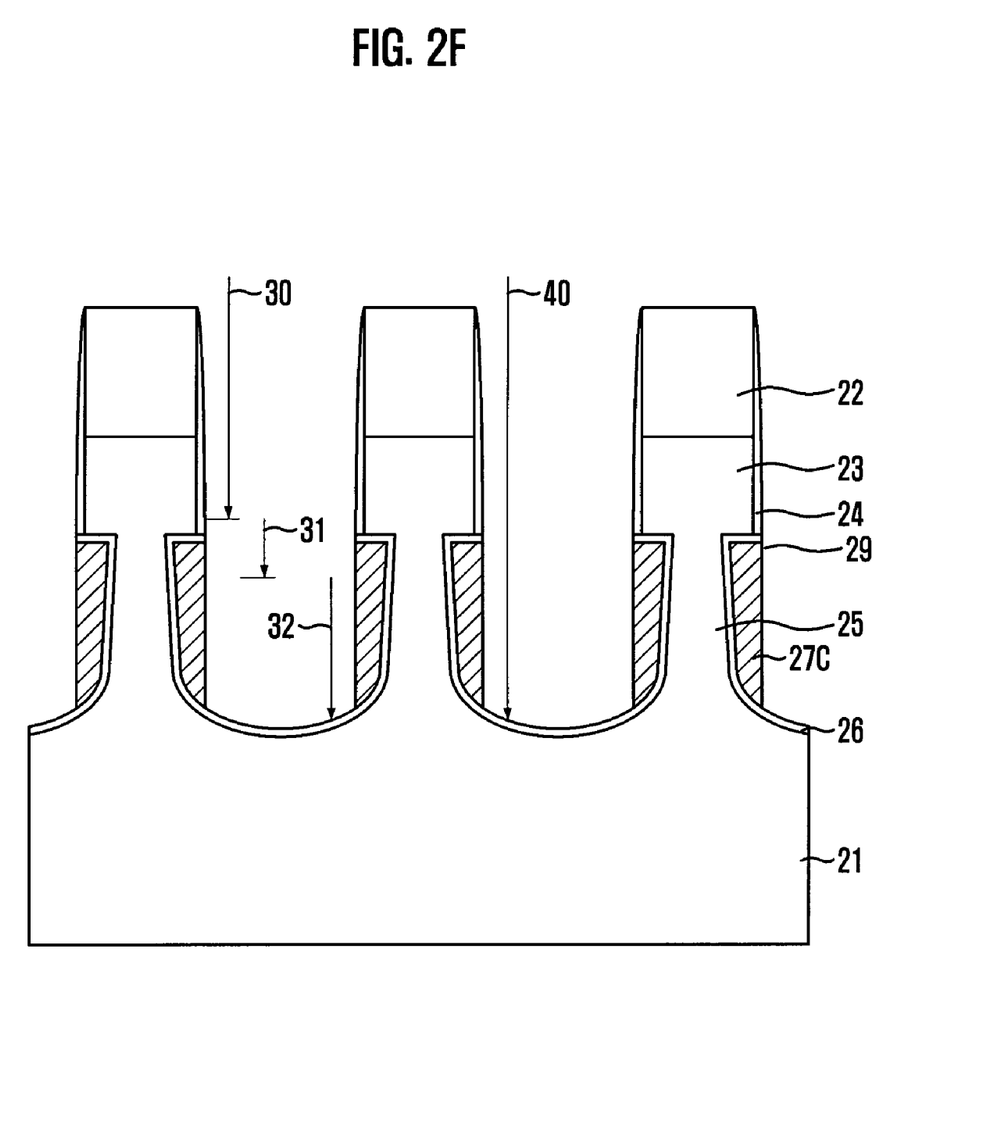

As shown in FIG. 2F, a gate electrode 27C is formed to surround the pillar neck 25 by anisotropically etching the twice-etched conductive layer 27B using the passivation layer 29 as an etch barrier or mask. In some embodiments, the passivation layer 29 is subsequently wasted or otherwise removed. Accordingly, the gate electrode 27C has a vertical side wall.

Since the gate electrode 27C is formed after etching the conductive layer 27 from the sidewalls of the gate hard mask pattern 22 and the pillar head 23 as shown in FIGS. 2C and 2D, potential loss of the gate insulation layer 26 and the substrate 21 is prevented due to the lowering of the etching target.

In disclosed embodiments, the gate electrode 27C is formed through patterning the conductive layer 27 in multiple steps. Since the desirable etching target of the conductive layer 27 is divided into several smaller etching targets, e.g., as designated at 30, 31, and 32 in FIG. 2F, it is possible to prevent potential damages of the gate insulation layer 26 and the substrate 21 compared to when a single etching process is performed with one large etching target 40. The multiple etching processes performed on the conductive layer 27 include, in some embodiments, not only at least an isotropic etching process but also at least an anisotropic etching process.

Here, the reference numeral 30 denotes an etching target of the etching process of FIG. 2C, the reference numeral 31 denotes an etching target of the etching process of FIG. 2D, and the reference numeral 32 denotes an etching target of the etching process of FIG. 2F.

The method of fabricating a semiconductor device described above can prevent or at least reduce potential loss of the gate insulation layer and the substrate in the process of forming the gate electrode.

Therefore, the stability and reliability of the semiconductor device can be improved, and manufacture yield can be also improved.

While various embodiments have been described, it will be apparent to those skilled in the art that various changes and modifications may be made.

What is claimed is:

1. A method of fabricating a semiconductor device on a substrate, the method comprising:
   forming at least one pillar pattern having a pillar head and a pillar neck on the substrate;
   forming a gate insulation layer that surrounds the pillar neck;
   forming a conductive layer over the substrate having the gate insulation layer on the pillar neck; and
   forming a gate electrode that surrounds the gate insulation layer on the pillar neck by performing multiple etching processes on the conductive layer,
   wherein the multiple etching processes performed on the conductive layer comprise:
      an isotropic etching process performed on a portion of the conductive layer exposed from a sacrificial layer pattern partially filling a gap between adjacent pillar patterns;
      a first anisotropic etching process performed on both the isotropically-etched conductive layer and the sacrificial layer pattern; and
      a second anisotropic etching process performed, after the sacrificial layer pattern has been removed, on the once-anisotropically-etched conductive layer to obtain the gate electrode.

2. The method of claim 1, wherein a top surface of the sacrificial layer pattern that defines the exposed portion of the conductive layer is higher than a boundary between the pillar neck and the pillar head.

3. The method of claim 1, further comprising:
   forming a passivation layer in a spacer shape on a sidewall of the once-anisotropically-etched conductive layer and on a sidewall of the pillar head that is exposed after the isotropic etching process and the first anisotropic etching process.

4. The method of claim 3, wherein the passivation layer comprises a nitride layer.

5. The method of claim 1, wherein the sacrificial layer is removed through wet-etching.

6. The method of claim 2, wherein the sacrificial layer pattern is formed by depositing a sacrificial layer to fill the gap between the adjacent pillar patterns; and partially removing the sacrificial layer to obtain the sacrificial layer pattern.

7. The method of claim 2, wherein an etching target of the first anisotropic etching process is set below the boundary between the pillar head and the pillar neck.

8. The method of claim 2, wherein an etching recipe of the first anisotropic etching process is selected such that the isotropically-etched conductive layer and an adjacent portion of the sacrificial layer pattern are etched faster than a central portion of the sacrificial layer pattern between the adjacent pillar patterns.

9. A method of forming a gate electrode from a conductive layer deposited over a substrate having thereon at least one pillar pattern which comprises a pillar head, a pillar neck and a gate insulation layer that surrounds the pillar neck, the method comprising:
performing sequentially multiple different etching processes on the conductive layer to form the gate electrode that surrounds the gate insulation layer on the pillar neck;
wherein each of the multiple etching processes removes partially a thickness of the conductive layer to reduce the possibility of over-etching the substrate and/or the gate insulation layer;
wherein the multiple etching processes performed on the conductive layer comprise an isotropic etching process, a first anisotropic etching process, and a second anisotropic etching process; and
wherein the isotropic etching process removes the conductive layer from above the pillar head to a first etching target which is above a boundary between the pillar neck and the pillar head;
the first anisotropic etching process removes the conductive layer from the first etching target to the boundary, and partially removes a side portion of the conductive layer from the boundary to a second etching target; and
a second anisotropic etching process partially removes the conductive layer below the second etching target but under the pillar head, and removes the conductive layer below the second etching target but not under the pillar head.

10. The method of claim 9, further comprising:
forming a sacrificial layer pattern partially filling a gap between adjacent pillar patterns;
wherein a top surface of the sacrificial layer pattern defines the first etching target and a portion of the conductive layer exposed above the top surface of the sacrificial layer pattern is removed during the isotropic etching process.

11. The method of claim 10, wherein both the conductive layer and the sacrificial layer pattern are partially removed during the first anisotropic etching process.

12. The method of claim 11, wherein the conductive layer is etched faster than the sacrificial layer pattern during the first anisotropic etching process.

13. The method of claim 10, further comprising after the first anisotropic etching process and before the second anisotropic etching process, removing the sacrificial layer pattern.

14. The method of claim 13, further comprising after removing the sacrificial layer pattern, forming a passivation layer in a spacer shape on sidewalls of the conductive layer and the pillar head above the first anisotropic etching target;
wherein the passivation layer is used as an etch barrier or mask during the second anisotropic etching process.

15. The method of claim 10, wherein the sacrificial layer pattern is formed by depositing a sacrificial layer to fill the gap between the adjacent pillar patterns; and partially removing the sacrificial layer up to the first etching target to obtain the sacrificial layer pattern.

* * * * *